(12) United States Patent
Vezina

(10) Patent No.: US 10,401,405 B2
(45) Date of Patent: Sep. 3, 2019

(54) ELECTRICAL METER CENTER

(71) Applicant: Siemens Canada Limited, Oakville, Ontario (CA)

(72) Inventor: Sebastien Vezina, St-Celestin (CA)

(73) Assignee: SIEMENS CANADA LIMITED, Oakville, Ontario (CA)

(*) Notice: Subject to any disclaimer, the term of this patent is extended or adjusted under 35 U.S.C. 154(b) by 84 days.

(21) Appl. No.: 15/171,650

(22) Filed: Jun. 2, 2016

(65) Prior Publication Data

US 2016/0356831 A1 Dec. 8, 2016

Related U.S. Application Data

(60) Provisional application No. 62/170,181, filed on Jun. 3, 2015, provisional application No. 62/170,183, filed
(Continued)

(51) Int. Cl.
| | |
|---|---|
| *H02B 1/03* | (2006.01) |
| *H02B 1/04* | (2006.01) |
| *H02B 1/14* | (2006.01) |
| *H02B 1/20* | (2006.01) |
| *H02G 3/10* | (2006.01) |
| *H02G 3/22* | (2006.01) |

(Continued)

(52) U.S. Cl.
CPC ........... *G01R 22/065* (2013.01); *G01R 22/00* (2013.01); *H02B 1/03* (2013.01); *H02B 1/04* (2013.01); *H02B 1/14* (2013.01); *H02B 1/20* (2013.01); *H02G 3/086* (2013.01); *H02G 3/10* (2013.01); *H02G 3/185* (2013.01); *H02G 3/22* (2013.01); *H02G 5/04* (2013.01); *H05K 5/0004* (2013.01); *H05K 5/0204* (2013.01); *H05K 5/0217* (2013.01); *H05K 5/0239* (2013.01); *H05K 5/04* (2013.01); *H02G 3/081* (2013.01)

(58) Field of Classification Search
CPC ........ G01R 22/065; G01R 22/00; H05K 5/04; H05K 5/0239; H05K 5/0004; H05K 5/0217; H05K 5/0204; H02B 1/14; H02B 1/20; H02B 1/03; H02B 1/04; H02G 3/081; H02G 3/086; H02G 3/22; H02G 3/10; H02G 3/185; H02G 5/04
See application file for complete search history.

(56) References Cited

U.S. PATENT DOCUMENTS

| | | | | |
|---|---|---|---|---|
| 3,955,123 | A | * 5/1976 | Goodridge | ............... H02B 1/03 |
| | | | | 361/660 |
| 4,327,396 | A | * 4/1982 | Schacht | ................. H02B 1/305 |
| | | | | 361/648 |

(Continued)

*Primary Examiner* — Akm Zakaria

(57) ABSTRACT

There is described an electric meter center comprising electric meter sockets and breakers. The electric meter center comprises an electric meter area comprising compartments, each one of the electric meter sockets being in one of the electric meter area compartments. It further comprises a breaker area distinct from the electric meter area and comprising compartments, each one of the breakers being in one of the breaker area compartments. There is a physical separation between the breaker area and the electric meter area. There is provided a plurality of panels, each one of the panels for covering at least one compartment, the at least one compartment to be covered by one of the panels being only within the same area.

16 Claims, 10 Drawing Sheets

Related U.S. Application Data on Jun. 3, 2015, provisional application No. 62/170,184, filed on Jun. 3, 2015, provisional application No. 62/170,187, filed on Jun. 3, 2015, provisional application No. 62/170,188, filed on Jun. 3, 2015, provisional application No. 62/170,190, filed on Jun. 3, 2015, provisional application No. 62/170,192, filed on Jun. 3, 2015.

(51) Int. Cl.

| | | |
|---|---|---|
| *H02G 5/04* | (2006.01) | |
| *H05K 5/04* | (2006.01) | |
| *H02G 3/08* | (2006.01) | |
| *H02G 3/18* | (2006.01) | |
| *H05K 5/00* | (2006.01) | |
| *H05K 5/02* | (2006.01) | |
| *G01R 22/00* | (2006.01) | |
| *G01R 22/06* | (2006.01) | |

(56) References Cited

U.S. PATENT DOCUMENTS

| | | | |
|---|---|---|---|
| 4,916,574 A | 4/1990 | Hancock et al. | |
| 6,205,017 B1 | 3/2001 | Wilkie, II et al. | |
| 6,266,233 B1* | 7/2001 | O'Regan | H02B 1/50 |
| | | | 174/38 |
| 7,049,516 B1 | 5/2006 | Haag et al. | |
| 7,450,368 B2 | 11/2008 | Parker et al. | |
| 7,969,750 B2 | 6/2011 | Jur et al. | |
| 2011/0299228 A1* | 12/2011 | Milovac | H02B 11/26 |
| | | | 361/614 |
| 2012/0326518 A1* | 12/2012 | Rusch | H02J 7/34 |
| | | | 307/80 |
| 2013/0240485 A1 | 9/2013 | Yabu et al. | |
| 2014/0099820 A1* | 4/2014 | Robinson | H02B 1/03 |
| | | | 439/517 |
| 2014/0348556 A1* | 11/2014 | Baba | G03G 15/0812 |
| | | | 399/284 |

* cited by examiner

ELECTRICAL METER CENTER

CROSS-REFERENCE TO RELATED APPLICATIONS

This application claims priority from US provisional patent applications U.S. 62/170,181, U.S. 62/170,183, U.S. 62/170,184, U.S. 62/170,187, U.S. 62/170,188, U.S. 62/170,190 and U.S. 62/170,192, all filed Jun. 3, 2015, the specifications of which are hereby incorporated herein by reference in their entirety.

BACKGROUND (a) Field

The subject matter disclosed generally relates to electric meters and enclosures. More particularly, the subject matter relates to panels and doors providing access to such enclosures.

(b) Related Prior Art

Electrical equipment such as, without limitation, relays, circuit breakers, electric meters, transformers, and the like, are typically housed within an enclosure (or housing, box or cabinet), in order to restrict access to the electrical equipment installed therein. This is to restrict potential injuries, and to prevent unauthorized tampering with the electrical equipment. UL standards (in the US) or the CSA standards (in Canada) also need to be taken into consideration.

In the electric metering technology, there are commercial electric meter centers (also known as stacks or cabinets) which are used for commercial and industrial purposes such as, without limitation, shopping centers, industrial facilities, condominiums, warehouses, oil and gas industries, office buildings, etc. These facilities are large enough to require a large electric meter center with a plurality of electric meters, each one of them being dedicated to a specific part of the facility (e.g., each tenant in a shopping mall).

The present disclosure addresses shortcomings in the electric metering technology field.

SUMMARY

According to an embodiment of the invention, there is provided an electric meter center comprising electric meter sockets and breakers. The electric meter center comprises: an electric meter area comprising electric meter area compartments, each one of the electric meter sockets located in one of the electric meter area compartments; a breaker area distinct from the electric meter area and comprising breaker area compartments, each one of the breakers located in one of the breaker area compartments; a physical separation between the breaker area and the electric meter area; and panels, each one of the panels covers at least one compartment of the electric meter area compartments and the breaker area compartments, the at least one compartment covered by one of the panels being within the same one of the electric meter area and the breaker area.

According to an aspect, the panels for covering the electric meter area compartments are sealably and releasably fastened to the electric meter center.

According to an aspect, the panels for covering the breaker area compartments are releasably fastened to the electric meter center independently from the panels for covering the electric meter area compartments, so that the panels for covering the breaker area compartments can be removed while leaving the panels for covering the electric meter area compartments sealably fastened to the electric meter center.

According to an aspect, the panels for covering the breaker area compartments overlap the panels for covering the electric meter area compartments, wherein the panels for covering the breaker area compartments can be removed while leaving the panels for covering the electric meter area compartments sealably fastened to the electric meter center.

According to an aspect, each one of the panels is for covering exactly one compartment.

According to an aspect, the physical separation comprises a vertical wall extending between a back and a front of the electric meter center and from a bottom of one of the electric meter area and the breaker area to a top thereof.

According to an aspect, the vertical wall presents no opening that would permit passage of a hand between compartments of adjacent areas.

According to an aspect, the vertical wall comprises openings to allow a passage of electrical connections between compartments.

According to an aspect, the electric meter center further comprises horizontal physical separations between adjacent breaker area compartments and between adjacent electric meter area compartments.

According to an aspect, the horizontal physical separations comprise a frontward slope.

According to an aspect, the electric meter center further comprises a cable routing area comprising cable routing area compartments, each one of the cable routing area compartments comprising one set of lugs for connection to one of the electric meter sockets.

According to an aspect, the electric meter center further comprises a vertical wall extending between a back and a front of the electric meter center and from a bottom of one of the electric meter area, the breaker area and the cable routing area to a top thereof to physically separate the cable routing area from the electric meter area.

According to an embodiment of the invention, there is provided an electric meter center comprising electric meter sockets and breakers. The electric meter center comprises: electric meter area compartments, each one of the electric meter sockets located in one of the electric meter area compartments; breaker area compartments distinct from the electric meter area compartments, each one of the breakers located in one of the breaker area compartments, each one of the breaker area compartments corresponding to an adjacent one of the electric meter area compartments; electric meter panels, each one of the electric meter panels covering exactly one of the electric meter area compartments; and breaker panels, each one of the breaker panels covering exactly one of the breaker area compartments and overlapping a portion of at least one of the electric meter panels of the adjacent one of the electric meter area compartments thereby preventing the electric meter panels from being removed if the breaker panels are not first unsealed or removed.

According to an aspect, the electric meter center further comprises seals wherein each one of the electric meter panels are sealably fastened to the electric meter center using one of the seals.

According to an aspect, the one of the seals of an electric meter panel is unaffected by a removal of an adjacent one of the breaker panels.

According to an aspect, the electric meter center further comprises a cable routing area enclosing one set of lugs for each one of the electric meter sockets for electrical connection thereto, further comprising cable routing panels covering the cable routing area.

According to an aspect, the cable routing panels overlap a portion of the electric meter panels covering the electric meter area thereby preventing the electric meter panels from being removed if the cable routing panels are not first unsealed or removed.

According to an aspect, the electric meter center further comprises walls physically separating the electric meter area compartments from adjacent ones of the breaker area compartments and from the cable routing area, the electric meter panels, the breaker panels and the cable routing panels being fastened to the electric meter center via the walls.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

Electric meter centers comprise a plurality of internal areas, usually horizontal bar areas, breaker areas, meter areas, and routing areas. Nonetheless, other types of areas are possible. The meter area comprises sockets for the electric meters. The electric meters have several electrical contacts (i.e., the jaws), usually three on the line side, one ground contact (neutral connection), and three on the load side, the latter being defined herein as "meter connections". Meter connections (usually three for the three phases of the utility power source) stem from the electric meter and are directed toward a routing area, where each meter connection ends with a lug (or any other equivalent connector) which is electrically connected to an electric cable.

The internal areas are often covered with panels or doors which extend over wide parts of the meter center. Removing one of the panels gives access to many internal areas at the same time.

Figure 10:
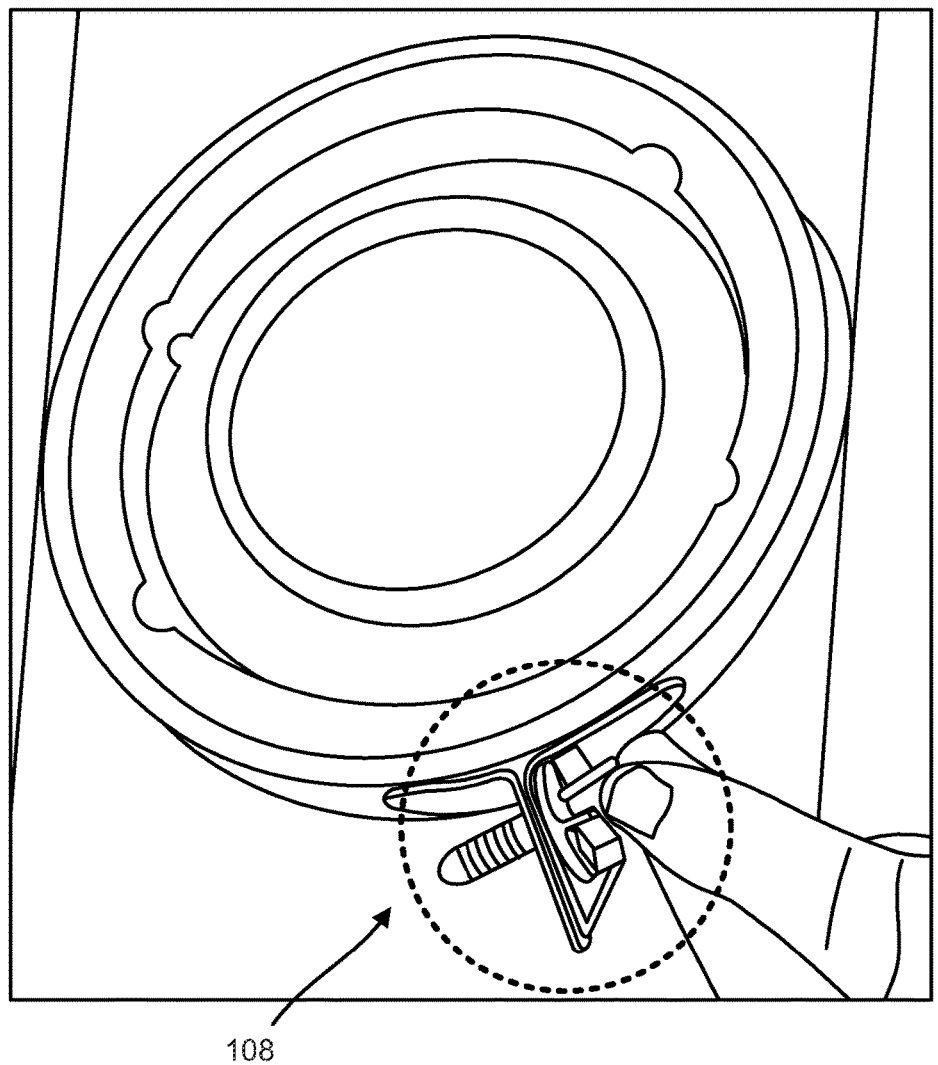
FIG. 10 is a picture of an electric meter center, showing a seal of an electric company, according to an embodiment.

It was found that the existing panels and doors mentioned above, and the areas of the cabinet that are covered by them, are not suited for specific tasks for which only one part of the meter center is to be accessed (e.g., yearly maintenance, upgrade or addition of electric meters, torque check, etc.). Moreover, some portions, especially the electric meter area, can only be accessed by authorized personnel of the utility company owning the electric meter. If the maintenance to the breaker area requires authorized staff from the utility company because the electric meter area is also uncovered, maintenance becomes less efficient and more costly than it should be, since authorized personnel must be scheduled and present when some work is being performed even though they do not need to work themselves on the electric meter center. The authorized staff must be present to remove and replace the seal, i.e., a physical mechanism that is used to secure access to a meter's metrological adjustments and legally relevant parameters so that access or changes to metrological adjustments and legally relevant parameters will be detectable, as usually mandated by regulations. A seal 108 that can be sealed or unsealed by authorized staff of an electric power company is shown in FIG. 10.

There is therefore a need for a more convenient access to the internal parts of the electric meter center. More particularly, there is a need for a system which does not require authorized staff from the power distribution company to unlock electric meter sections for maintenance on other sections.

There are disclosed embodiments of an electric meter center having areas comprising compartments and panels covering the compartments. The embodiments should also meet national standards, such as the UL or CSA standards.

Figure 1:
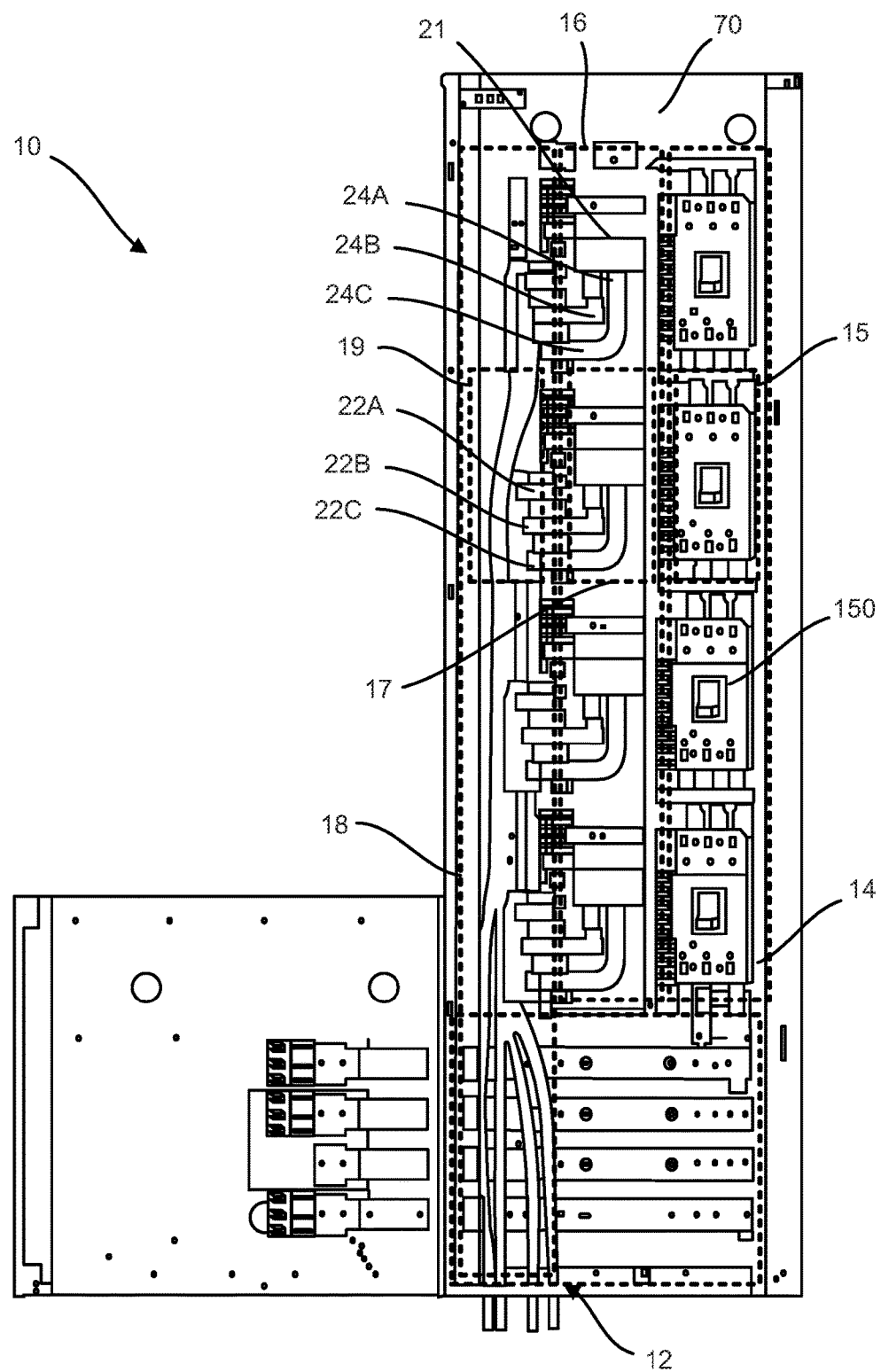
FIG. 1 is a front view of an electric meter center, showing its various internal areas, most notably the electric meter area, the routing area and the breaker area, according to an embodiment.

Referring now to the drawings, and more particularly to FIG. 1, there is shown an electric meter center 10. The electric meter center 10 is the enclosure that includes a plurality of internal areas, each one of the areas comprising compartments being dedicated to a specific purpose. The electric meter center 10 comprises, without limitation, a horizontal bar area 12 where horizontal conduction busbars are located, a breaker area 14 for housing breakers, an electric meter area 16 for housing electric meter sockets (and an electric meter in the socket), a cable routing area 18 for passing electric cables thereinto (the electric cables being routed to an exit of the meter center 10), and the like.

Still referring to FIG. 1, there is shown that the electric meter area 16 of the electric meter center 10 comprises a plurality of electric meter sockets 21 for installing electric metering devices thereon. More particularly, there is shown that the meter area 16 of the electric meter center 10 comprises four meter sockets 21 being vertically distant from each other. A horizontal offset (not shown) could also exist. Each one of the plurality of electric meter sockets 21 has electrical contacts or jaws (usually seven), three of them being herein defined as meter connections 24, more specifically three meter connections 24A, 24B, 24C, ending in a lateral orientation and being terminated with lugs 22A, 22B, 22C, respectively. (Other jaws include line jaws 26A, 26B, 26C, not shown, and the ground or neutral connection 24N.) Each lug 22A, 22B or 22C extends from a respective one of the three-phase bus bars connectors 24A, 24B, 24C. Electric cables are routed from the lugs 22A, 22B, 22C to outside of the meter center 10, either at the top or at the bottom (as in FIG. 1, see bottom of cable routing area 18).

However, it should be understood that one, two, three, four, or more sockets can be provided in the meter center 10. Additional unoccupied space can be provided for future use. For example, a whole meter center 10 may be installed with only one electric metering device knowing that there will be future tenants in the building and that new electric metering devices will need to be installed then. Other embodiments could also include an electric meter area 16 spanning on more than one column. However, FIG. 1 shows the embodiment comprising four electric meter sockets in a single column, with the electric meters not shown.

Still referring to FIG. 1, there is shown that the electric meter center 10 includes the cable routing area 18 which, according to an embodiment, is independent (distinct) from the electric meter area 16. The cable routing area 18 is for receiving the insulated electrical cables and the lugs 22A, 22B, 22C, as it will be described below, as well as the neutral connection 24N, while the meter area 16 is for receiving the plurality of electric metering devices 20 and housing their sockets 21, each one comprising bus bars, also known as meter connections 24, 24B, 24C.

The meter center usually comprises a back cover or tub, namely the meter center back 70, which is the surface on which at least some of the internal equipment may be fixed.

The meter center 10 is shown as being divided in three areas: the breaker area 14 on the right, the electric meter area 16 in the center, and the cable routing area 18 on the left (lower parts of the meter center 10 are no more considered in the present description).

As mentioned above, a meter center 10 usually comprises space for more than one electric meter. For this reason, each one of the areas mentioned above is divided in a plurality of compartments. More specifically, the breaker area 14 comprises breaker compartments 15, the electric meter area 16 comprises electric meter compartments 17, and the cable routing area 18 comprises cable routing compartments 19.

Each one of the electric meter compartments comprises one electric meter, each one of the breaker compartments comprises one breaker and each one of the cable routing compartments comprises one set of lugs (22A, 22B, 22C) extending therein. Each one of the electric meter compartments is associated with a corresponding one of the breaker compartments (for the breaker corresponding with the electric meter) and a corresponding one of the routing compartments (for connecting the lugs extending the electric meter), usually adjacent to the electric meter compartment being considered.

For practical reasons (safety, protection of equipment, reliability of the electrical system, compliance with UL and/or CSA standards, etc.), all these compartments need to be covered by panels. These panels need to be removed for maintenance, installation or reparation of equipment in the meter center 10.

Figure 2:
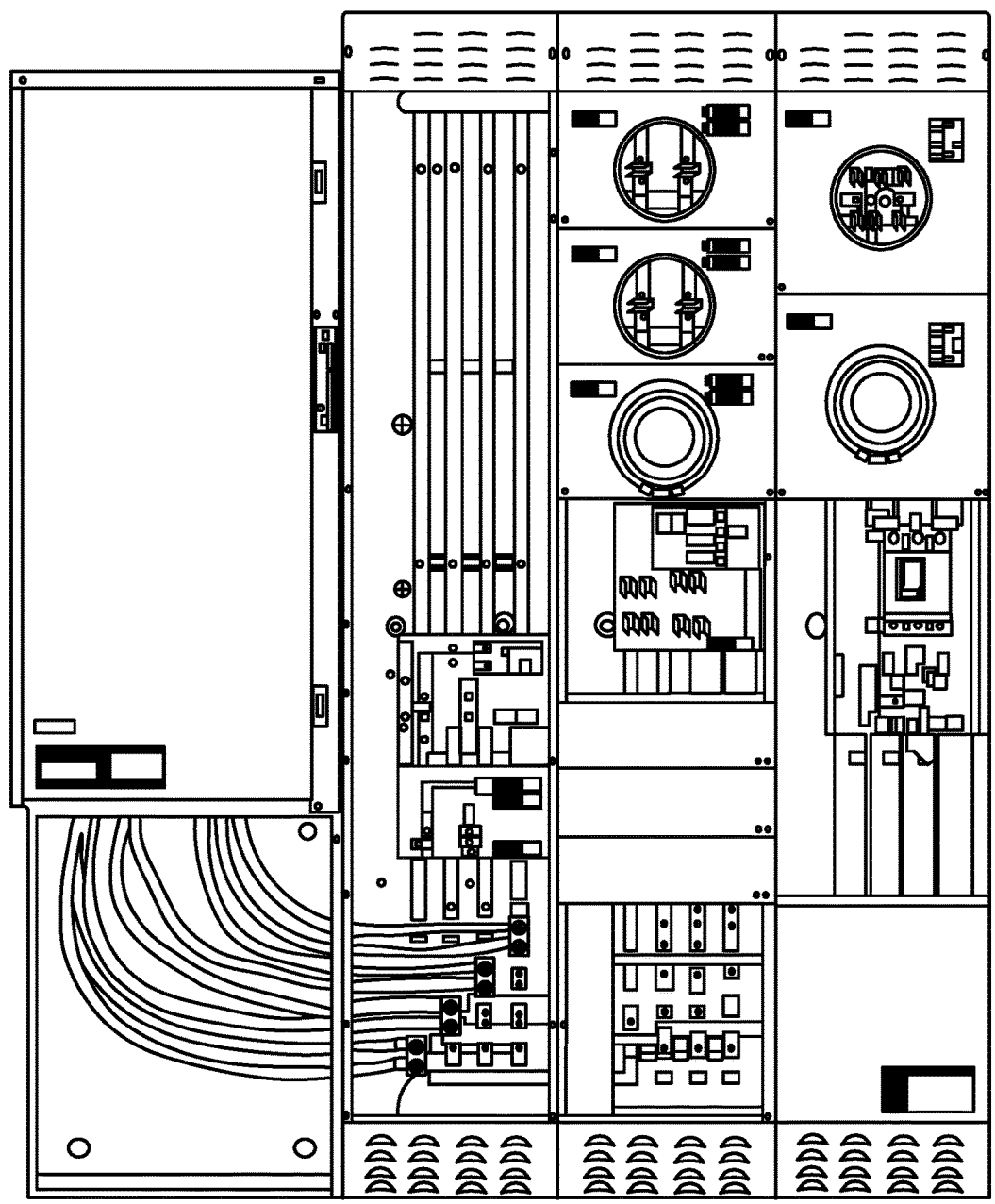
FIG. 2 is a picture showing a prior art electric meter center, according to an embodiment.

FIG. 2 shows a prior art meter center, in which the electric meter area is adjacent to the breaker area. There is a very steep turn for routing cables (on the left). Breakers are under the same panel as their corresponding electric meter. Panels extend along the whole width of the meter center to cover simultaneously an electric meter and its corresponding breaker.

In this case, if a worker needs to work on the breaker, he will have to remove the panel which covers the whole width of the meter center. In order to do so, he will have to call-in an authorized employee from the electricity distribution company to remove the seal 108 on the electric meter and to reinstall the seal 108 thereafter. This is cumbersome and inefficient, since employees of two different companies are required simultaneously on-site (the powered meter center 10 should never be left unattended without panels).

Figure 3:
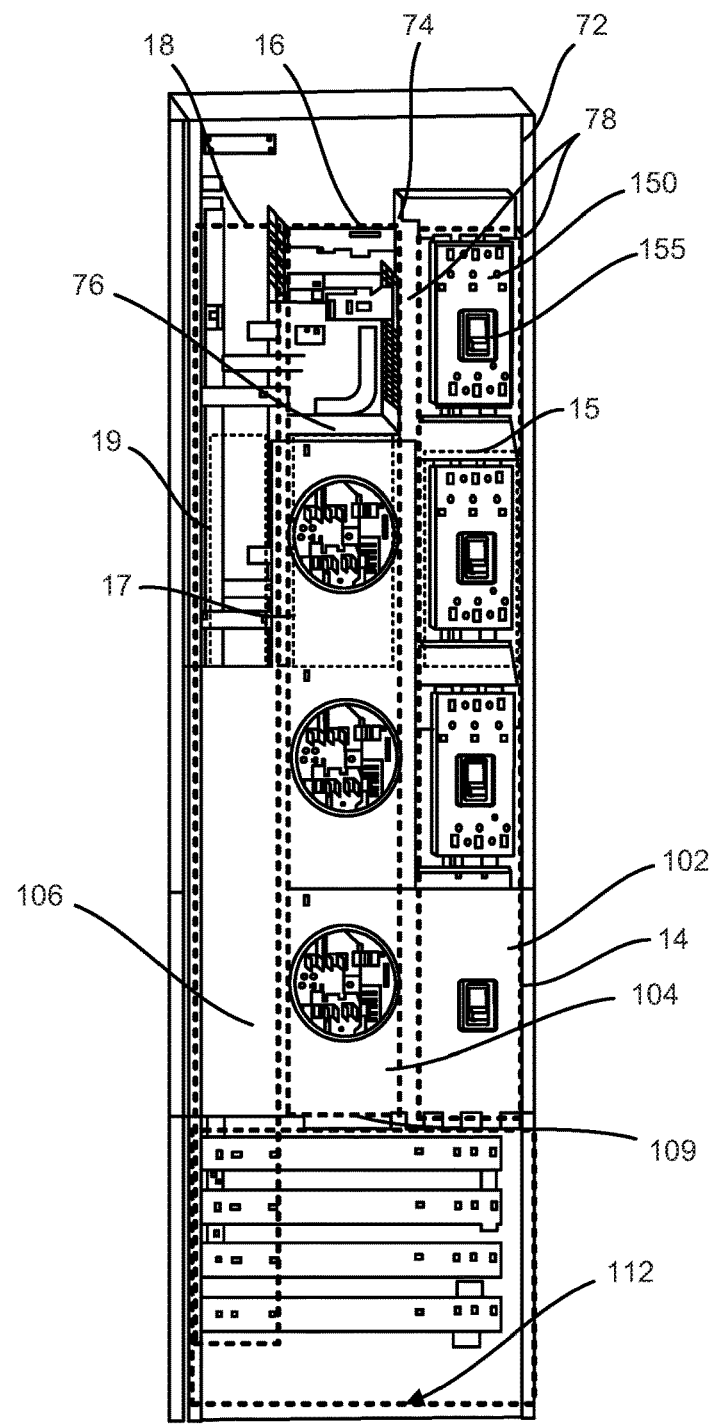
FIG. 3 is a front view of an electric meter center, showing its various internal areas, most notably the electric meter area, the routing area and the breaker area, and panels covering a selection of the compartments making up these areas, according to an embodiment.

FIG. 3 shows a meter center 10 divided in compartments and having panels 100 covering specific compartments.

In FIG. 3, the breaker area 14 and the electric meter area 16 comprise four rows. Each row spans on these two areas and on the cable routing area 18 and comprises a breaker compartment 15, an electric meter compartment 17 and a cable routing compartment 19. Any other reasonable number of rows can be provided (usually at least two).

In the embodiment shown in FIG. 3, each compartment is to be covered by a dedicated panel. Some compartments are shown covered by that panel and other are shown uncovered. A panel covering a breaker compartment 15 is a breaker panel 102. A panel covering an electric meter compartment 17 is an electric meter panel 104. A panel covering a cable routing compartment 19 is a routing panel 106.

An area is defined as a set of many compartments of the same type. Usually, these similar compartments are located on top of each other so that an area forms a column, as seen in FIG. 1 (areas are columns). FIG. 3 shows that these areas are physically separated by an inner vertical wall 74 which extends from the meter center back 70 toward the front of the meter center 10, and from the bottom of an area to the top thereof. This inner vertical wall 74 physically separates equipment between different areas along the depth of the meter center 10. Of course, these inner vertical walls 74 cannot be plain walls since wiring, busbars and the like need to go from one area to another one. Therefore, the inner vertical walls 74 comprise openings or other types of holes (e.g., ventilation holes) to let these elements pass therethrough, and/or to let the air flow between compartments and areas, for example for cooling down warmer devices (e.g., breakers).

However, the presence of openings for wiring or other types of holes such as ventilation holes should not allow the passage of a hand through the inner vertical walls 74, at least between the electric meter area and the breaker area. In some cases, the separation with the cable routing area can have larger openings (of a few inches large and a few inches high) in which small hands could pass; a hinged panel can be provided and the hinge is sealed to restrict access between the areas. Indeed, the presence of the inner vertical walls 74 forming a physical separation between compartments and between areas should prevent a hand of a person to pass from one compartment to another one without having to remove a dedicated panel in front of a compartment to be accessed. In other words, if a compartment is being accessed, no other compartment of a different area should be accessed at the same time. Ventilation holes should thus be small enough to prevent hands, and preferably fingers and tools, to reach a compartment of an adjacent area. The inner vertical wall 74 should therefore extend in space sufficiently to cover an area that blocks hands, fingers, tools, etc., and it should be solid enough (in terms of material and fastening method) to remain in place if someone pushes on the inner vertical wall 74.

Similarly, there may be provided an inner horizontal wall 76, as seen in FIG. 3. The inner horizontal wall 76 physically separates two adjacent compartments within the same area, for example an electric meter compartment and its upper neighbor. No inner horizontal wall 76 can be provided in the cable routing area 18 since cables need to be routed from bottom to top through all compartments (covered by routing panels 106) making up this area. As for the inner vertical walls 74, various types of holes can be provided (for example, for ventilation), as seen in FIGS. 7-8, where the presence of holes in the physical separations between compartments (inner horizontal wall 76 and inner vertical walls 74), and the absence of inner horizontal wall 76 in the cable routing area 18, are apparent.

The inner vertical wall 74 can be terminated (at its most distal end from the meter center back 70, closest to the front of the meter center 10) by a wall edge 78. The wall edge 78 is a narrow surface extending from top to bottom of the inner vertical wall 74.

Figure 7:
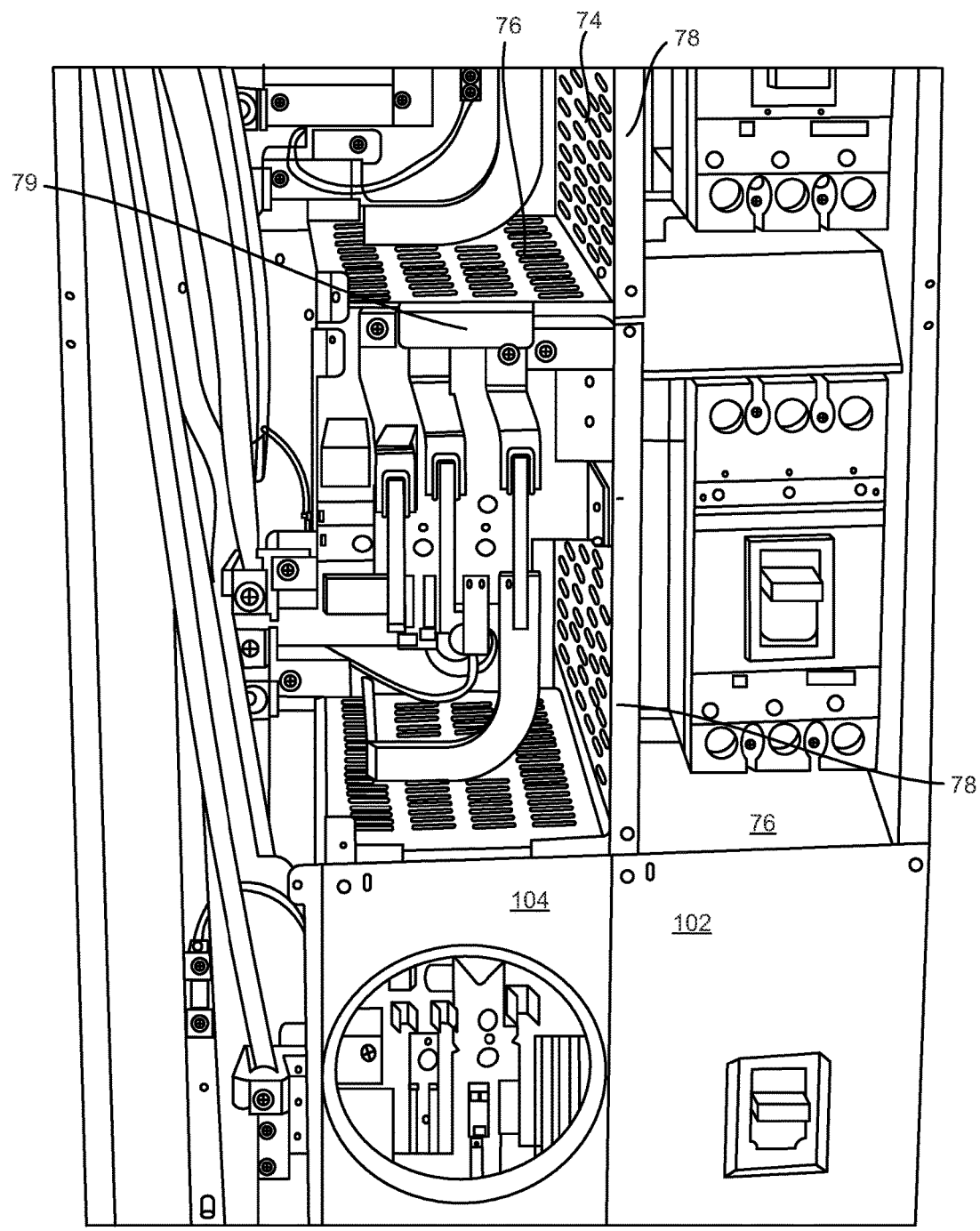
FIG. 7 is a picture of an electric meter center, showing its various internal areas, most notably the electric meter area, the routing area and the breaker area, with some panels installed, according to an embodiment.
Figure 8:
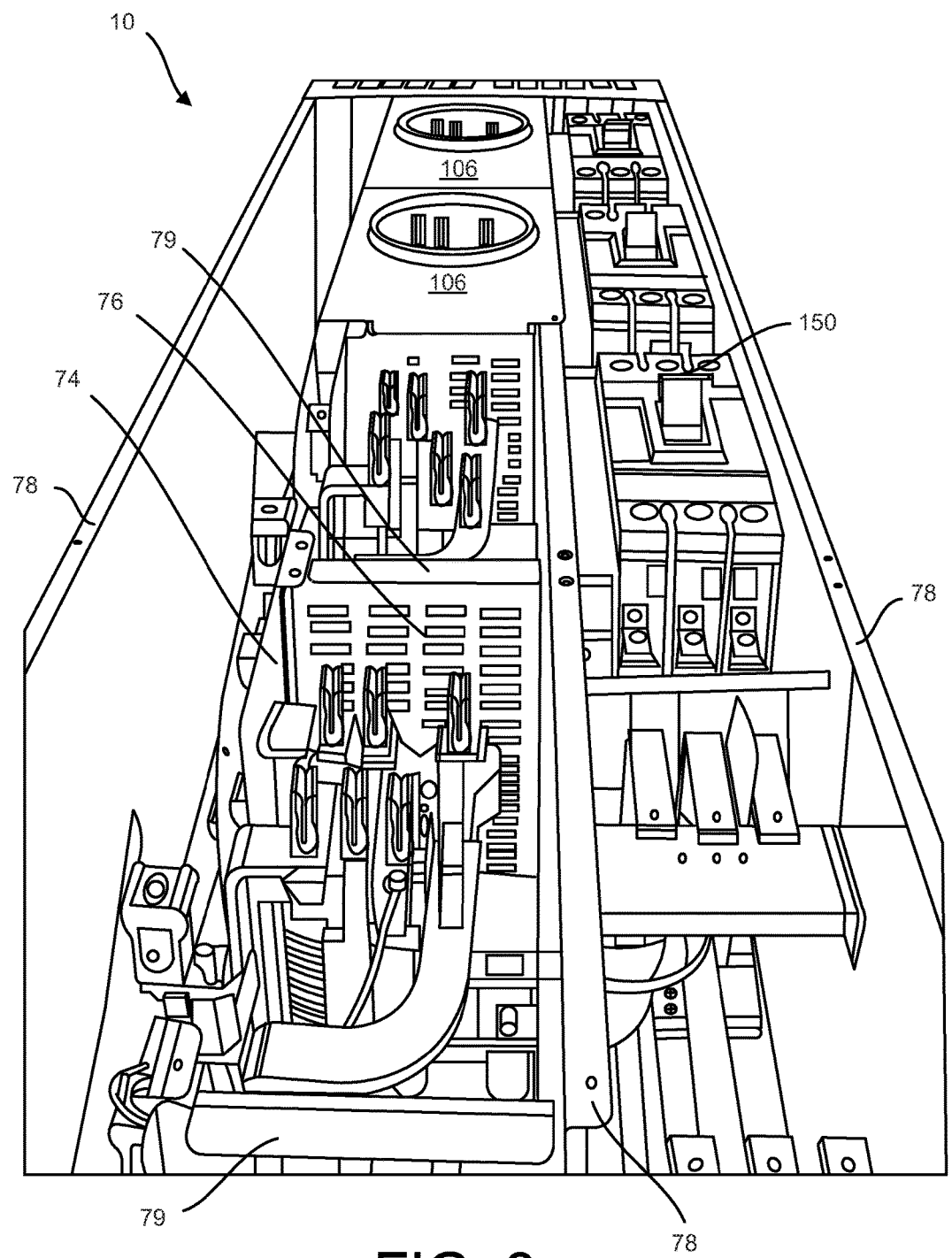
FIG. 8 is a picture (bottom perspective view) of an electric meter center, showing its various internal areas, most notably the electric meter area, the routing area and the breaker area, with other panels installed, according to an embodiment.

As seen in FIGS. 3 and 7-8, wall edges 78 provide a support for panels 100 installed on the meter center 10. More precisely, each panel 100 can be attached to the wall edges 78 which extend vertically and usually correspond (at least approximately) to the sides of the panel. According to an embodiment, the panels 100 comprise holes 101 that are coincident with the wall edges 78 when the panel 100 is in place, so that the holes 101 can be used to insert a screw thereinto and screw the panel 100 to at least one of the wall edges 78. In this case, a minimal number of two screws is preferable (usually required by standards) to ensure a proper attachment of the panel 100 to the meter center 10.

Figure 9:
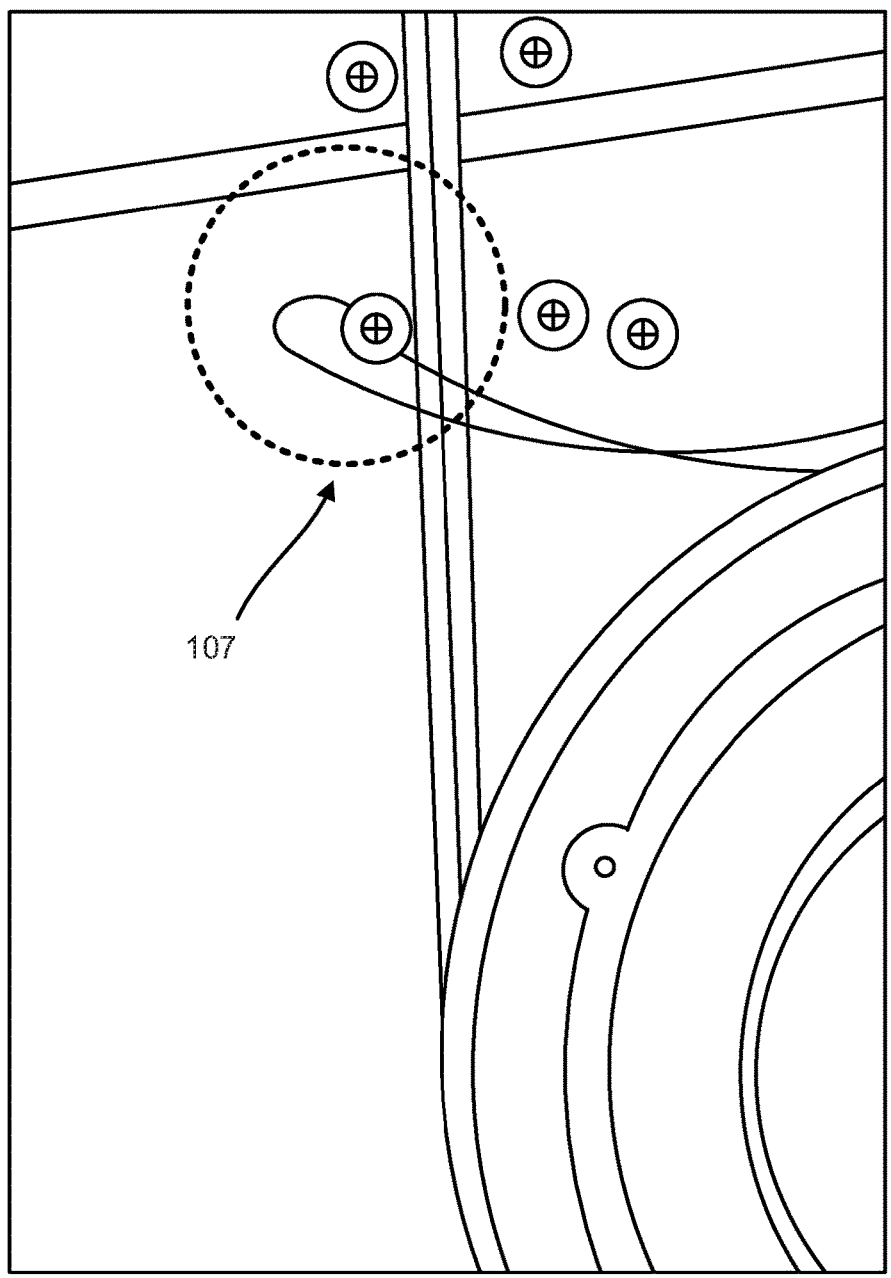
FIG. 9 is a picture of an electric meter center, showing a sealed screw, according to an embodiment.

Other types of attachments are possible, as known in the art, as long as the attachment is not permanent (such as soldering or welding) since the panels 100 need to be removed occasionally (e.g., for recommended yearly maintenance). A pin-hole combination could work as a suitable replacement for the screw, for example. Velcro™ type attachments, as long as they are resistant enough, could also work, although these types of attachments are uncommon in the art of electric meter centers, contrarily to screws, which are usually preferred, since standards usually require that meter panels be sealable (i.e., panels should be sealably fastened; fastening requires to put a seal 108, shown in FIG. 10, and unfastening requires to remove the seal 108). The seal includes any fastener that can prevent the removal of a panel 100 by an unauthorized person and that indicates if it was forced or modified, as known in the field of meter connections. For example, FIG. 10 shows that the opening in the electric meter panel 104 is filled by an electric metering device 20; the seal 108 comprises a collet around the electric metering device 20 which prevents the removal of the electric meter panel 104. Independently from the seal 108, a sealable screw 107 for sealing any panel is shown in FIG. 9.

According to another embodiment, the panels 100 may be provided as hingeable panels. In this case, a hinge (or a plurality of them) is provided on (or along) one of the four sides of the panel 100 so that it can be pivoted around that hinge, in the same manner that a house door is moved about its hinges. For example, panels 102 and 106 may be attached with a hinged side, while panels 104 would be attached to the meter center 10 with screws. If a hinge is used, the hinge should comprise a hingeable V-shaped member (e.g., the hinge of a door) that can be permanently fastened to both the panel 100 and one of the wall edges 78 to provide the hinge of the panel 100 with respect to hingeable V-shaped member. One of the two parts of the hingeable V-shaped member can be an integral part of either the panel 100, either the wall edge 78.

The panels 100 need to be at least as large as the compartment they are supposed to cover, i.e., as large as the distance between wall edges 78. They need to cover the height of the compartment too, i.e., the distance between inner horizontal walls 76 if such walls are provided.

According to CSA standards, panels 100 are required to overlap with an adjacent panel. As shown in FIG. 7, breaker panels 102 have a leftward extension that overlaps on the adjacent area, i.e., while the electric meter panel 104 overlaps on its right-hand wall edge 78, the corresponding breaker panel 102 overlaps on its left-hand wall edge 78, which is the same wall edge 78, and therefor overlaps on a portion of the electric meter panel 104 too, with a common screw holding both panels together on that wall edge 78. This is advantageous since it means that the breaker panels 102 can be removed without having to remove the seal 108 on the electric meter panels 104.

Therefore, panels 100 can be mostly independent from other panels 100, but having them overlap creates a set of rules, i.e., an order in which panels 100 can be removed. In this case, the electric meter panels 104 can remain sealably fastened to the electric meter center when the breaker panels 102 are being removed. It implies that the presence of authorized staff for sealing/unsealing is not required to perform maintenance work within the breaker area, which is enclosed by its breaker panels 102 and physically separated from the electric meter area 16 thanks to the vertical walls 72. Access to the breakers is therefore independent from the sealing/unsealing of the electric meter area 16. However, in this exemplary embodiment, the reverse is not true: sealing/unsealing of the electric meter area 16 requires prior unsealing or removal of the breaker panels 102. Since the electric meter panels 104, the same reasoning applies to relation between the electric meter area 16 and the cable routing area 18. The same applies to the cable routing panels 106 which can overlap over the electric meter panels 104 and be removed while leaving the electric meter panels 104 in place. This is assuming the screws in common with both panels is not sealed or have been unsealed, since it can be sealed as shown in FIG. 9 where a sealed screw 107, common to adjacent compartments of different areas, is shown. For example, the electric meter panel can be removed (i.e., removing the panel while removing its seal 108) without removing the breaker panel as long as the breaker panel is unsealed or not sealed at the screw level (sealed screw 107) and the proper common screws are removed. Usually, each panel comprises on sealed screw 107 which can be a common screw; the electric meter panels 104 have additional access restrictions and therefore comprise an additional seal 108.

Alternatively, interlocking tabs can be provided on the sides of the panels 100. These tabs or fingers would fit in complementary openings on adjacent panels so that panels are interlocked and so that a panel can be removed by withdrawing a tab from the opening in the adjacent panel in which the tab is inserted.

According to an embodiment, the inner horizontal walls 76 have a wall edge at their front end similarly to the inner vertical walls 74. In this case, the inner vertical walls 74 may be provided without such a wall edge 79, since wall edges 79 are there to provide attachment support in the corners of the panels 100. For each compartment, only one set of wall edges (78, 79) is necessary, but both can be provided, as seen in FIGS. 7-8.

Figure 5:
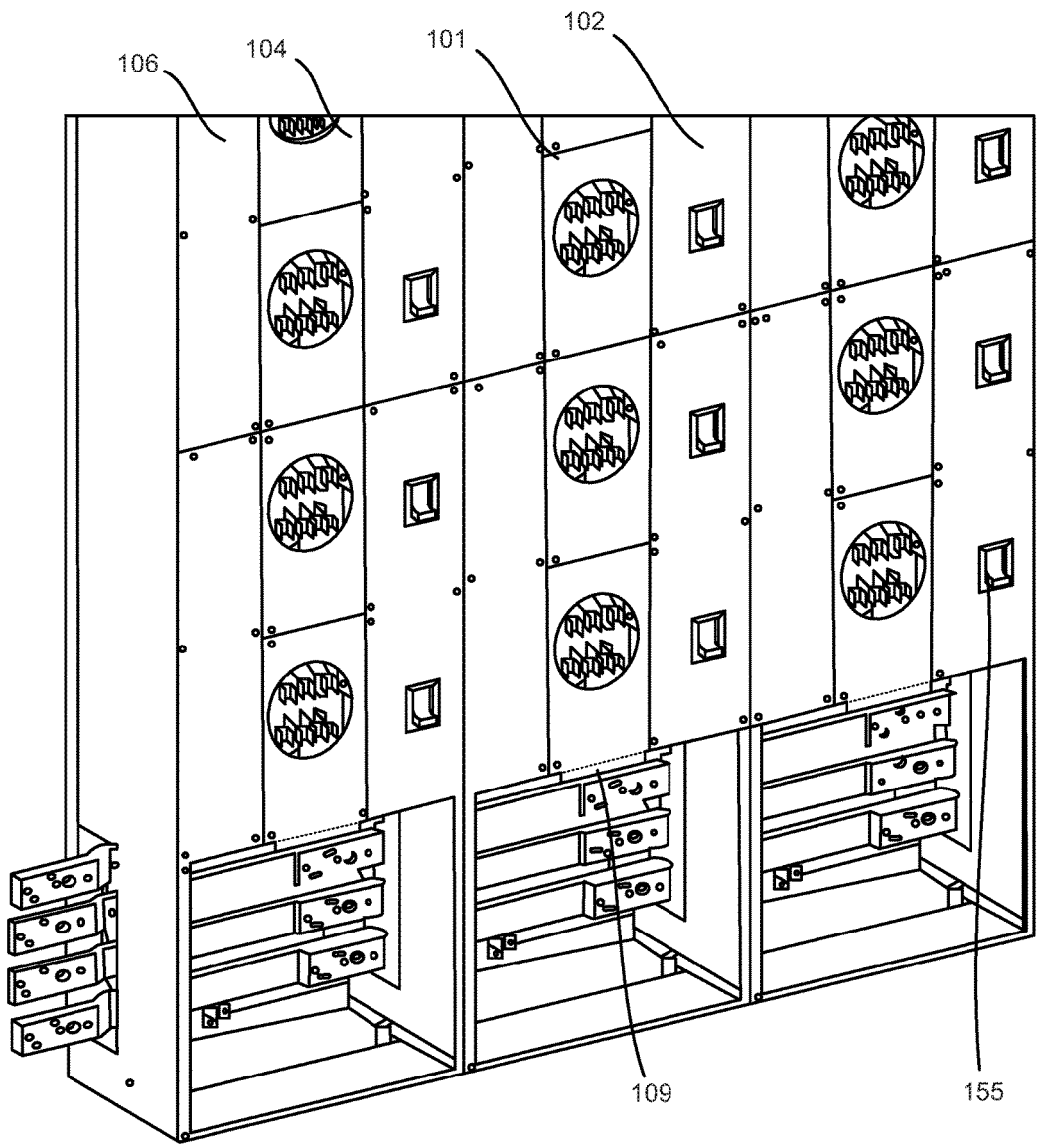
FIG. 5 is a perspective view showing the lower portion of stacked electric meter centers, with the bottom thereof being exposed, and comprising panels covering compartments making up the areas of the meter center, according to an embodiment.

According to an embodiment, panels 100 can be provided with an extension 109, as seen in FIGS. 3 and 5. The extension 109 can lean on (or be supported by) at least one of the following: the inner horizontal wall 76, the wall edge 79 of the inner horizontal wall 74, and the panel located under that given panel 100. This support can be useful either during installation or permanently.

According to an embodiment, the wall edges 78 do not extend along the whole height or width of a compartment, but rather extend only a small portion thereof, for example, in the corners only, to provide attachment support.

Figure 6:
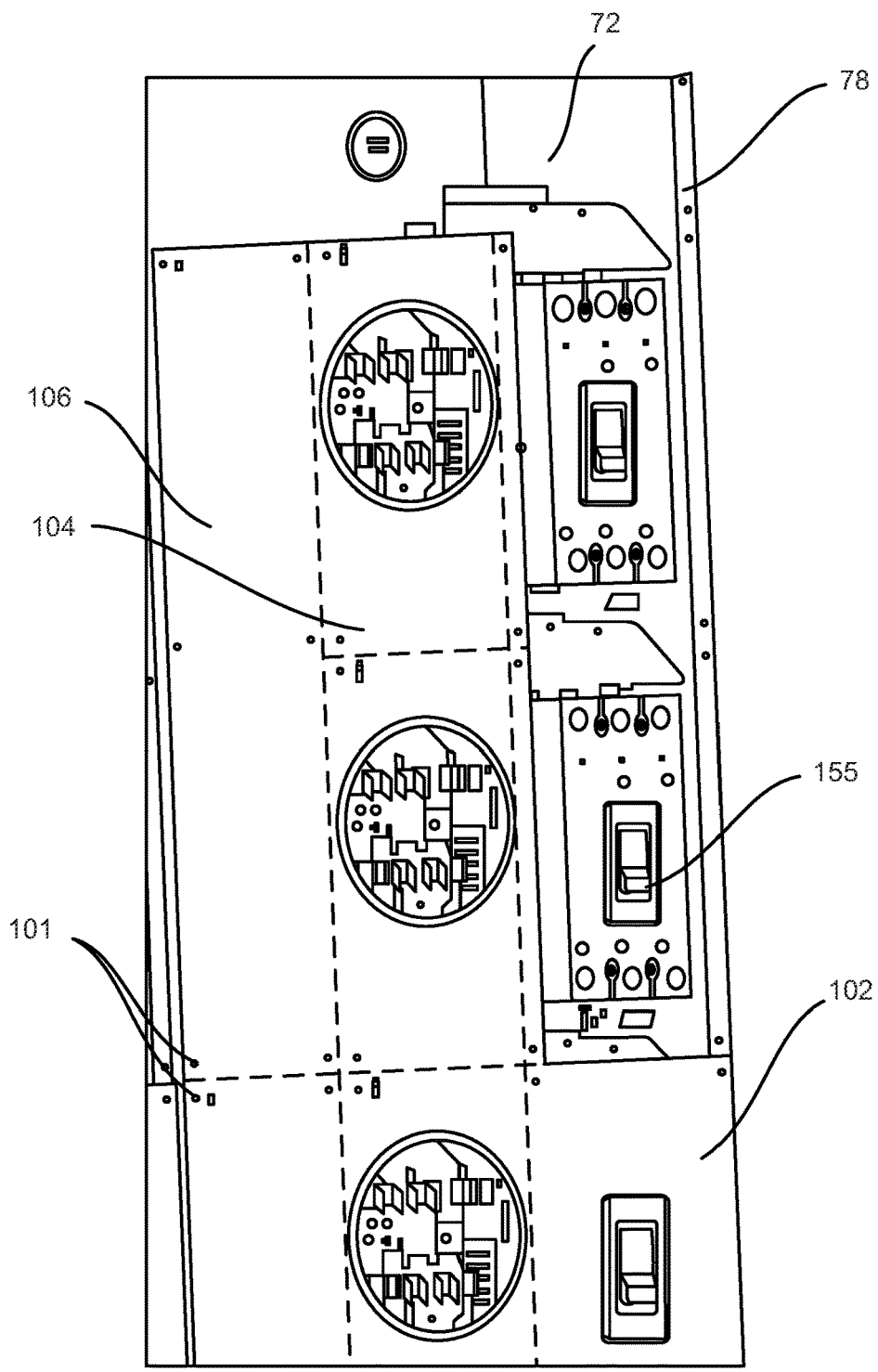
FIG. 6 is a perspective view showing the upper portion of an electric meter center comprising panels covering some of the compartments making up the areas of the meter center, according to an embodiment.

As seen in FIGS. 3, 6 and 8, all inner walls do not need to extend in a perpendicular fashion from the meter center back 70. For example, while the horizontal and vertical inner walls (76, 74) around the electric meter compartments 17 extend perpendicularly from the meter center back 70, the inner horizontal wall 76 between two breaker compartments 15 extends in a diagonal fashion. i.e., it is not purely horizontal since it has a vertical inclination. The inner horizontal wall 76 is characterized as extending from the back to the front of the electric meter center and from the left to the right of a compartment; however, it can have a slope such as a frontward downward slope, i.e., the further the inner horizontal wall 76 is from the back (or the closer it is to the front), the further it goes down. It is also possible to make the inner horizontal wall 76 with a slope on only a portion thereof, as shown in FIG. 7, where the upper breaker area compartments are physically separated from their bottom neighbor by inner horizontal wall 76 having a frontward and downward sloped portion close to the front and a flat portion close to the back. In this case, breaker screws that slip and fall hit the frontward sloped portion are brought to the front (or outside) of the electric meter center to avoid falling in the adjacent bottom compartment which may have its panel still installed.

According to an embodiment, all relevant parts are metallic sheets. They are sized according to their purpose and, if necessary, are bent at specific locations thereon. For example, the inner walls (74, 76) are metallic sheets which are bent to provide the wall edge 78 at their front end. They can also be bent at the opposite edge, i.e., close to the meter center back 70 in order to form another edge that can be attached (screwed, or soldered, welded, glued, nailed, etc.) to the meter center back 70.

According to another embodiment, the inner walls (74, 76) do not have a wall edge (78, 79). The equivalent of that edge is rather provided on the panels 100, which are bent or provided with a perpendicular inward extension that extends within the meter center parallel to the inner walls to be attached thereto. The perpendicular edge for providing attachment support is therefore provided on the panels 100 instead of on the inner walls (74, 76).

According to an embodiment, panels 100 include openings to let some equipment extend out of the enclosure formed by the meter center 10, such as electric metering devices 20 and breaker switches 155.

Figure 4:
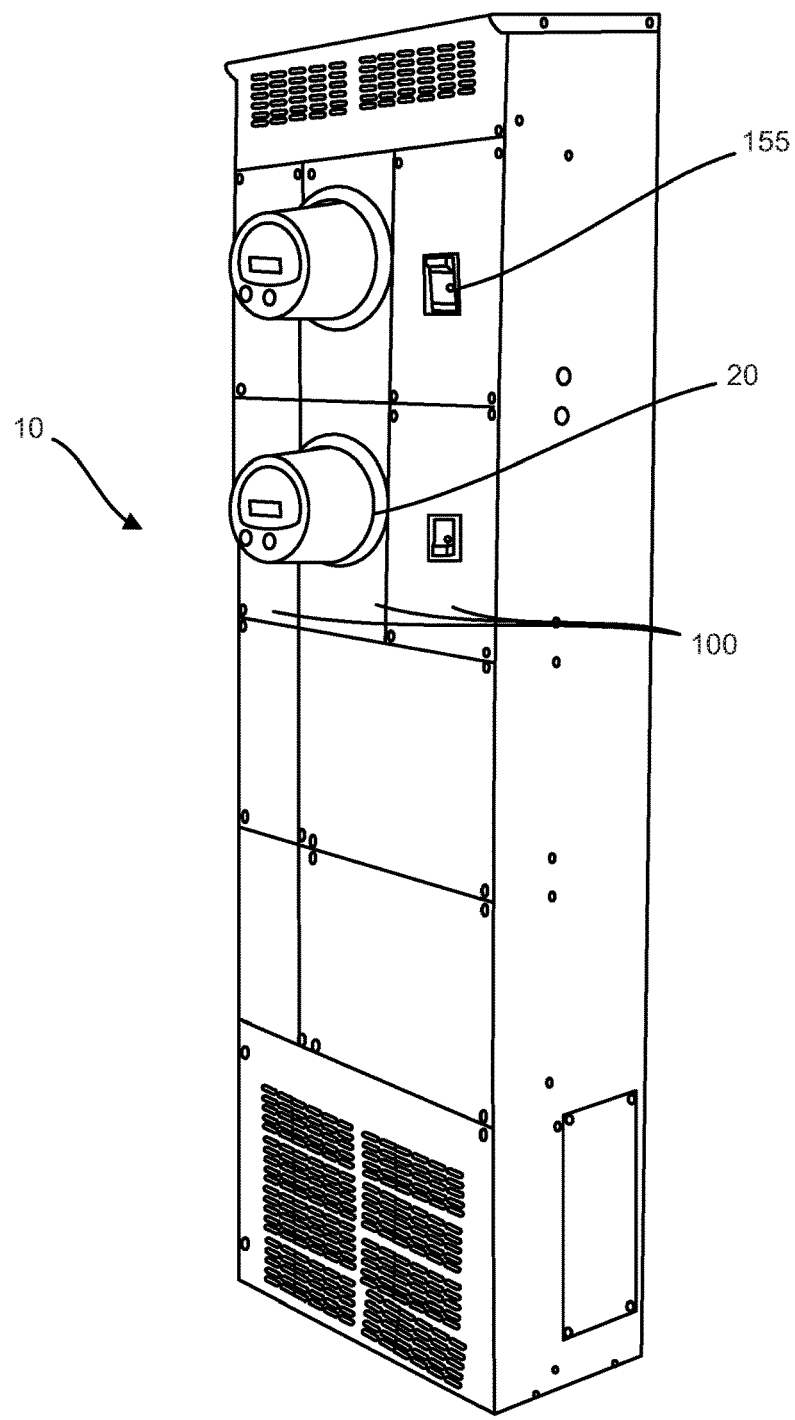
FIG. 4 is a picture showing an electric meter center comprising panels covering all compartments making up the areas of the meter center, according to an embodiment.

FIG. 4 is a depiction of a meter center 10 with panels 100 installed thereon for hiding the compartments. Only external elements can be seen, such as the electric metering devices 20 and breaker switches 155.

According to an embodiment, the panels 100 cover more than one compartment simultaneously. This can be seen in FIGS. 5-6, wherein a routing panel 106 covers two routing panels at the same time. However, if a panel 100 is to cover two or more compartments simultaneously, these compartments belong to the same area.

According to an embodiment, the cable routing area 18 extends on the horizontal bar area 12, as seen in FIG. 1. According to an embodiment, a dedicated routing panel 106 is used to cover that compartment. According to another embodiment, the horizontal bar area 12 has its own panel and the part which belongs to the cable routing area 18 too is covered by this panel.

Therefore, when a worker needs to access a specific section of the meter center 10, they will only need to remove the panel 100 which covers the specific portion on which work is needed. For yearly maintenance, the worker can remove only the panel 106 for the routing area without having to coordinate with the authorized employee from the electricity distribution company to remove the electric meter panel 104. The same applies for a situation in which the breaker would need to be changed. Prior art meter centers would have required the presence of an employee of the electricity distribution company to unseal and to remove the panel covering both the breaker and the electric meter to perform this task; the presently described meter center 10 gets rid of this inefficient requirement.

It will be noted that the walls and panels advantageously comprises bent metal portions, which are simple to manufacture. The only steps needed are bending and making small holes (for screwing). This simplicity (no machining or complex parts needed) is reflected in a low cost of production.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. An electric meter center, comprising:
   electric meter sockets;
   breakers;
   a meter center back;
   an electric meter area comprising electric meter area compartments, each one of the electric meter sockets located in a corresponding one of the electric meter area compartments;
   a breaker area, distinct from the electric meter area, comprising breaker area compartments, each one of the breakers located in a corresponding one of the breaker area compartments;
   a physical separation between the breaker area and the electric meter area;
   a plurality of electric meter area compartment front panels, each electric meter area compartment front panel covers at least one electric meter area compartment; and
   a plurality of breaker area compartment front panels, each breaker area compartment front panel covers at least one breaker area compartment,
   wherein each electric meter area compartment front panel and each breaker area compartment front panel are disposed opposite and parallel to the meter center back, and each breaker area front panel also overlaps a portion of a laterally adjacent electric meter area compartment front panel, wherein a first electric meter area compartment front panel of the plurality of electric meter area compartment front panels is sealably and releasably fastened to the electric meter center, and a first breaker area compartment front panel of the plurality of breaker area compartment front panels, laterally adjacent to the first electric meter area compartment front panel is releasably fastened to the electric meter center independently from the first electric meter area compartment front panel, such that the first breaker area compartment front panel can be removed while leaving the first electric meter area compartment front panel sealably fastened to the electric meter center.

2. The electric meter center of claim 1, wherein each one of the electric meter area compartment front panels is for covering exactly one electric meter area compartment.

3. The electric meter center of claim 1, wherein the physical separation comprises a vertical wall extending between the meter center back and a front of the electric meter center, and from a bottom of one of the electric meter area and the breaker area to a top thereof.

4. The electric meter center of claim 3, wherein the vertical wall presents no opening that would permit passage of a hand between compartments of adjacent areas.

5. The electric meter center of claim 4, wherein the vertical wall comprises openings to allow a passage of electrical connections between compartments.

6. The electric meter center of claim 1, further comprising horizontal physical separations between adjacent breaker area compartments and between adjacent electric meter area compartments.

7. The electric meter center of claim 6, wherein the horizontal physical separations comprise a frontward downward slope.

8. The electric meter center of claim 1, further comprising a cable routing area comprising cable routing area compartments, each one of the cable routing area compartments comprising one set of lugs for connection to one of the electric meter sockets.

9. The electric meter center of claim 8, further comprising a vertical wall extending between the meter center back and a front of the electric meter center, and from a bottom of one of the electric meter area, the breaker area, and the cable routing area to a top thereof to physically separate the cable routing area from the electric meter area.

10. An electric meter center, comprising:
electric meter sockets and breakers;
seals;
a meter center back;
electric meter area compartments, each one of the electric meter sockets located in a corresponding one of the electric meter area compartments;
breaker area compartments, distinct from the electric meter area compartments, each one of the breakers located in a corresponding one of the breaker area compartments, each one of the breaker area compartments corresponding to an adjacent one of the electric meter area compartments;
electric meter front panels, opposite and parallel to the meter center back, each one of the electric meter front panels covering exactly one of the electric meter area compartments; and breaker front panels, opposite and parallel to the meter center back, each one of the breaker front panels covering exactly one of the breaker area compartments and overlapping a portion of at least one of the electric meter front panels of the adjacent one of the electric meter area compartments, such that overlapping portions are opposite and parallel to the meter center back, thereby preventing the electric meter front panels from being removed if the breaker front panels are not first unsealed or removed, wherein each electric meter front panel is sealably and releasably fastened to the electric meter center with a corresponding one of the seals, and each breaker front panel is releasably fastened to the electric meter center independently from the electric meter front panels, so that the breaker front panels can be removed while leaving the electric meter front panels sealably fastened to the electric meter center.

11. The electric meter center of claim 10, wherein one of the seals of the electric meter front panel is unaffected by a removal of an adjacent one of the breaker front panels.

12. The electric meter center of claim 11, further comprising:
a cable routing area enclosing one set of lugs for each one of the electric meter sockets for electrical connection thereto; and
cable routing panels covering the cable routing area.

13. The electric meter center of claim 12, wherein the cable routing panels overlap a portion of the electric meter front panels covering the cable routing area thereby preventing the electric meter front panels from being removed if the cable routing panels are not first unsealed or removed.

14. The electric meter center of claim 13, further comprising walls physically separating the electric meter area compartments from adjacent ones of the breaker area compartments and from the cable routing area, the electric meter front panels, the breaker front panels and the cable routing panels being fastened to the electric meter center via the walls.

15. An electric meter center, comprising:
a meter center back;
an electric meter area, wherein the electric meter area includes a plurality of electric meter area compartments;
a breaker area, distinct from the electric meter area, wherein the breaker area includes a plurality of breaker area compartments, and each breaker area compartment of the plurality of breaker area compartments is disposed laterally adjacent to a corresponding electric meter area compartment of the plurality of electric meter area compartments, and the breaker area and electric meter area are separated from each other by a wall disposed therebetween;
a plurality of electric meter area compartment front panels, each electric meter area compartment front panel of the plurality of electric meter area compartment front panels is configured to cover a single electric meter area compartment; and
a plurality of breaker area compartment front panels, each breaker area compartment front panel of the plurality of breaker area compartment front panels is configured to cover a single breaker area compartment, and further includes a lateral extension portion that is configured to extend laterally towards an adjacent electric meter area compartment front panel, and overlap a portion of the adjacent electric meter area compartment front panel to provide an overlapping portion such that the overlapping portion is opposite and parallel to the meter center back, wherein each electric meter area compartment front panel of the plurality of electric meter area compartment front panels is sealably and releasably fastened to the electric meter center, and each breaker area compartment front panel of the plurality of breaker area compartment front panels is releasably fastened to the electric meter center independently from the electric meter area compartment front panels, so that the breaker area compartment front panels can be removed while leaving the electric meter area compartment front panels sealably fastened to the electric meter center.

16. The electric meter center of claim 15, wherein each electric meter area compartment of the plurality of electric meter area compartments is configured to receive a meter socket, and each breaker area compartment of the plurality of breaker area compartments is configured to receive a breaker.

* * * * *